United States Patent [19]
Miller et al.

[11] 3,988,171
[45] Oct. 26, 1976

[54] BONDED ELECTRICAL CONTACT FOR THERMOELECTRIC SEMICONDUCTOR ELEMENT

[75] Inventors: Norman C. Miller, Woodland Hills; Richard C. Saunders, Simi, both of Calif.

[73] Assignee: Rockwell International Corporation, El Segundo, Calif.

[22] Filed: Jan. 28, 1974

[21] Appl. No.: 437,100

Related U.S. Application Data

[60] Continuation of Ser. No. 150,325, June 7, 1971, abandoned, which is a division of Ser. No. 627,170, March 30, 1967, abandoned.

[52] U.S. Cl. .................................. 136/237; 136/238
[51] Int. Cl.² .......................................... H01V 1/14
[58] Field of Search ............ 136/205, 237, 238, 239

[56] References Cited
UNITED STATES PATENTS

| | | |
|---|---|---|
| 3,082,277 | 3/1963 | Lane et al. .......................... 136/237 |
| 3,208,835 | 9/1965 | Duncan et al. ...................... 136/237 |
| 3,306,784 | 2/1967 | Roes ................................... 136/237 |
| 3,382,109 | 5/1968 | Kendall, Jr. et al. ................ 136/237 |

*Primary Examiner*—Harvey E. Behrend
*Attorney, Agent, or Firm*—L. Lee Humphries; Henry Kolin

[57] ABSTRACT

A bonded electrical contact and method for a thermoelectric element. A thin layer of a ductile diffusion barrier, which is non-poisonous to thermoelectric materials, such as iron, tungsten, molybdenum, or niobium, is disposed between the thermoelectric material and a contacting shoe, such as stainless steel, which has poisonous alloy constituents. The thermal expansion coefficient of the diffusion barrier, which does not match that of the thermoelectric material, is overridden by that of the shoe, whose coefficient does correspond with that of such high expansion thermoelectrics as the telluriden.

6 Claims, 1 Drawing Figure

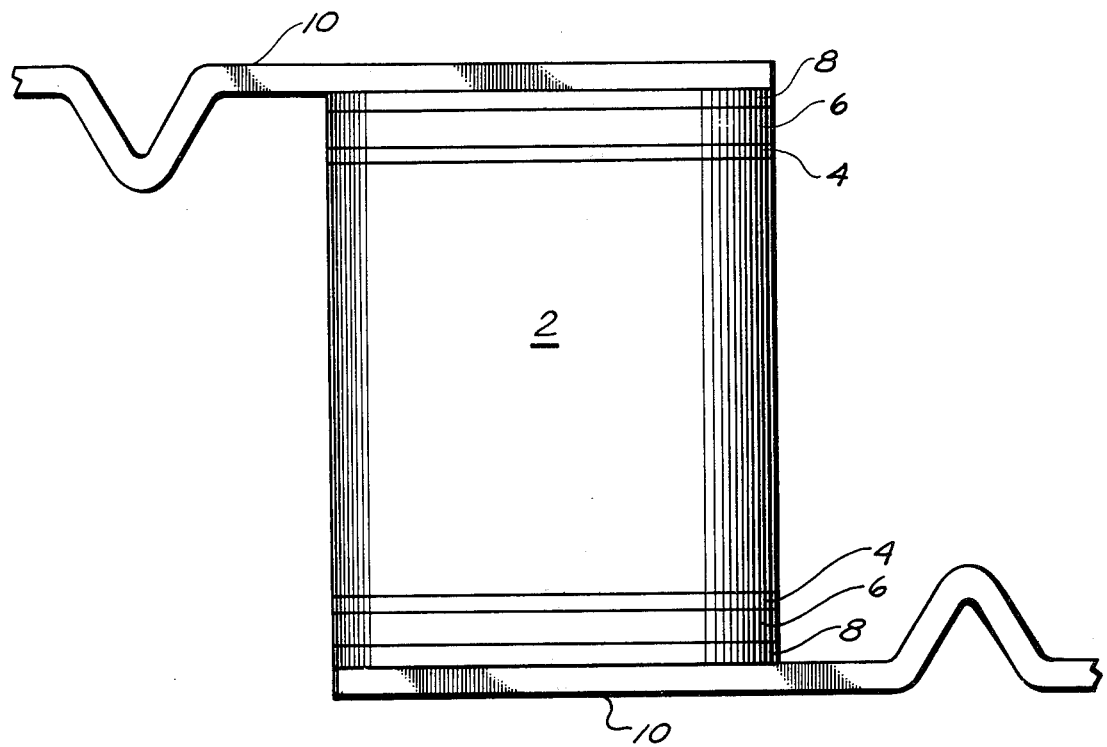
INVENTORS.
NORMAN C. MILLER
RICHARD C. SAUNDERS
Henry Kolin
ATTORNEY

BONDED ELECTRICAL CONTACT FOR THERMOELECTRIC SEMICONDUCTOR ELEMENT

This is a continuation of application Ser. No. 150,325, filed June 7, 1971, now abandoned, which is a division of application Ser. No. 627,170, filed Mar. 30, 1967, now abandoned.

BACKGROUND OF THE INVENTION

The present invention relates to a method and article for the electrical contacting of thermoelectric semiconductor elements.

Thermoelectric materials have the ability to convert heat directly to electricity without conventional rotating machinery. Thermoelectric generators are therefore highly desirable power sources for portable and remote applications. This is particularly the case where the power and life requirements of the generator are such as to make batteries, solar cells, or other electrical generators less attractive due to higher weight-to-power ratios, fuel requirements, noise, or other undesirable characteristics under severe environmental conditions. Thermoelectric materials are well known to the art and include such materials as germanium-silicon, zinc-antimony, copper-silver-selenium, bismuth telluride, lead telluride, germanium-bismuth telluride, tin telluride, lead-tin telluride, and Chromel-constantin.

A thermoelectric converter assembly generally comprises an array of thermoelectric materials, alternately doped with N-type and P-type dopants with electrical contacts joined thereto. One side of the element is connected to a hot junction or shoe in communication with a heat source, and the other side to a cold junction or shoe in communication with a heat sink such as an environmental radiator. The temperature differential impressed across the thermoelectric material serves to generate a voltage, in accordance with the Seebeck effect. Individual thermoelectric elements are connected by electrical leads, such as of copper, which are ordinarily brazed to the shoes.

The bonding of thermoelectric materials to electrical contacts imposes a number of severe materials constraints. The current-carrying ability of a thermoelectric material depends, as is known, upon the concentration and the purity of the thermoelectric material itself and of the dopants added thereto. N-type PbTe is made, for example, with $PbI_2$ as the dopant, P-type PbTe is doped with sodium, and P-type PbSnTe is doped with manganese. Trace amounts of certain other metals, such as copper, nickel, or chromium upset the necessary balance in the thermoelectric material, and thus by degrading current-carrying ability or affecting polarity, are said to be "poisonous". Therefore, such metals and their alloys cannot be used as the directly-facing electrical contacts for thermoelectric materials, although they may be good current conductors. On the other hand, there are other materials, such as pure iron, which do not poison thermoelectric semiconductors, and have in the past been used as contacting shoes to the copper electrical leads. Shoes of iron, however, are found to have certain drawbacks when utilized in high-temperature modules and in those which undergo frequent thermal cycling. These drawbacks derive principally from the fact that many thermoelectric materials, and in particular those containing tellurium, have thermal expansion coefficients which are far greater than that of iron. As a result of such thermal mismatch, the fragile and brittle thermoelectric materials are subject to fracture and other damage. This is because iron and telluride will not expand at the same rate at temperature, principally in the unrestrained radial direction, and will separate.

The principal object of the present invention, therefore, is to provide an improved method of bonding a thermoelectric material to an electrical contact.

Another object is to provide a method of bonding a tellurium-containing thermoelectric semiconductor to an electrical shoe in such a manner as to avoid poisoning of the thermoelectric material or thermal mismatch, while obtaining an efficient electrical contact.

Another object is to provide a bonded electrical contact between a thermoelectric material and an electrical conductor which is compatible thermally and electrically and which does not introduce poisons into the thermoelectric material.

The single drawing is a schematic representation of the bonded electrical contact for thermoelectric semiconductors provided by the present invention.

SUMMARY OF THE INVENTION

For a summary of the present invention, reference is made to the figure which shows a completed thermoelectric article having the following components: a semiconductor body 2; a thin layer of a compatible metal 4; a bonded shoe 6 of another metal which has approximately the same thermal expansion characteristics as the thermoelectric semiconductor; a layer of a braze material 8 for bonding the shoe to an electrical conductor; and a current-carrying strap 10 leading to the next thermoelectric element in an array.

The particularly significant aspect of the present invention lies in the use of a relatively thick shoe 4 (e.g., 16–20 mils) which is an electrical conductor, has a thermal expansion coefficient closely similar to that of the thermoelectric material, and is mechanically strong at temperature. This shoe is bonded to a thin layer 2 (e.g., 5 mils) of a metal which is not poisonous to the thermoelectric material and serves as a barrier against diffusion of alloy constituents of the shoe into the semiconductor. This layer of metal must be sufficiently thin and soft in order that its expansion coefficient will be overridden by that of the shoe, that is, it will be stretched or contracted with temperature change, principally in a radial direction, so that continuity will be maintained between the various bonded surfaces. In this manner a shoe material may be used whose properties, but for certain poisonous alloy constituents, are satisfactory. Likewise, a non-poisonous bonding material is feasible although its thermal expansion coefficient does not match that of the semiconductor.

DESCRIPTION OF THE PREFERRED EMBODIMENTS

To illustrate this conbination of a shoe material 6 and of a bonding material 4 which together cooperate in a highly satisfactory manner, and which individually are unsatisfactory, the shoe 6 is exemplary and preferably of an austenetic stainless steel. In particular, the 300 series stainless steels, for example type 302, have thermal expansion coefficients which closely match those of the high expansion semiconductors of the telluride class. Stainless steel is further advantageous in being mechanically strong at elevated temperatures, stable, and a good conductor of electricity. However, its alloy constituents chromium and nickel will diffuse into and poison semiconductors. Iron, tungsten, molybdenum, and niobium are examples of satisfactory diffusion barrier materials; these will not poison thermoelectrics, act as barriers against diffusion of nickel, chromium and the like therethrough, and may be conveniently bonded to both the stainless steel shoe and the thermoelectric material by such methods as diffusion bonding.

Since the diffusion barriers have relatively low thermal expansion coefficients (iron and tungsten by factors of 2 and 4, respectively, less than that of lead telluride) this layer of metal is made relatively thin. It is deformed upon heating between the semiconductor and the shoe so that the semiconductor will not be constrained or stresses introduced therein. A layer of about 0.002–008 in. of diffusion barrier metal is found to be satisfactory. These metals should be pure, and while they may be applied onto the stainless steel shoe by various means known to the art, including rolling and spraying (electroplating being difficult), it is preferred to plasma spray powders (mesh size of about −142 to +325) onto the stainless steel shoe. The shoe is first cleaned and roughened, to remove oxide film and provide a more adherent surface. The application of the metal in powder form to give a rough surface facing the thermoelectric material has a number of distinct advantages over a thin sheet form. For example, the irregular surface provides a greater area for contacting; hence lower electrical resistance. A higher point pressure is exerted by a rough than a smooth surface, which also promotes bonding. The so-coated stainless steel surface is then sintered in a nonoxidizing atmosphere in order to promote agglomeration and adherence of the metal powders, for example, by heating at a temperature of about 1800°–1950° F. for a period of about 15–45 minutes in a flowing hydrogen atmosphere.

The stainless steel shoe 6 is bonded to an electrical conductor strap 10 which connects one thermoelectric element 2 to another. The strap 10 may be of copper, nickel, iron, silver, or other suitable electrical conductor; copper is preferred. Brazing may be conveniently done by use of an intermediate braze material 8 whose selection among commercially available brazes is quite broad since, in view of the separation of the strap and the shoe from the thermoelectric material, concerns over poisoning and thermal properties are reduced. One satisfactory example for brazing a copper strap is a silver-copper-indium alloy. It is applied, in a layer of about 0.001 to 0.005 in., between the stainless steel shoe and the copper strap. It is found that when the conductor strap is of copper and the shoe is of stainless steel, brazing of the strap to the shoe is facilitated and improved by depositing a thin layer of nickel (not shown on drawing), for example by electroplating 1 mil on both the copper and the stainless steel.

The stainless steel shoe may be bonded to the thermoelectric material by utilizing various techniques, but the following is examplary and preferred. The stainless steel shoe is nickel plated on one side (for subsequent brazing) and plasma-sprayed on the other side with the fine powders of the diffusion barrier material, after which the coated shoe is sintered. The shoe is then bonded to the thermoelectric material by diffusion bonding. Diffusion bonding is known to the art for obtaining a solid state metal-to-metal bond by applying pressure at a selected temperature below the melting point of either member, which causes plastic deformation and flow of the members to effect a bond. The precise hot pressing parameters will be coordinated and will vary with the particular thermoelectric material, and the optimum conditions may be determined with respect thereto. For the telluride class of semiconductors, it is found that a temperature of about 1200°–1500° F. and pressure of about 2500–5000 p.s.i. for a period of about 5–30 minutes are satisfactory. The optimum temperature and pressure for PbTe (N) is about 1250°–1350° F. and and 3000 p.s.i; for PbTe (P) about 1250° F. and about 3000 p.s.i.; and for PbSnTe (P), about 1350°–1450° F. and 3000–5000 p.s.i. After the shoe is diffusion bonded to the thermoelectric material, the braze material may then satisfactorily be applied on the other (nickel-plated) surface of the shoe and the electrical strap connected thereto by melting of the braze material.

The following examples are offered to illustrate the present invention in greater detail.

EXAMPLE 1

Sheet stock of Type 302 stainless steel having a thickness of about 0.016–0.020 inch was electroplated with about 0.001 inch soft nickel on one face. Following the electroplating the other face of the sheet was grit blasted to remove oxides and to roughen the surface. Pure iron powder (about 99.5% purity) was thereafter plasma sprayed onto the roughened surface utilizing commercial plasma spraying equipment under the following conditions:

| | |
|---|---|
| Iron powder size | −140 to +325 mesh |
| Plasma gas flow | 30% |
| Powder gas flow | 40% |
| Gas type | argon |
| Current | 550 amperes |
| Distance | 5 – 6 inches |

Several passes were made with the spray gun until a coating having a thickness in the range of 0.005–0.006 inch was obtained. The plasma-sprayed sheet was then sintered in a flowing hydrogen atmosphere for one-half hour at a temperature of 1850°–1900° F.

Thermoelectric element caps were punched out of this sheet, using precision dies and punches, the caps being of a size about 1½% smaller than the thermoelectric element which was PbTe (N- and P-types), to allow for thermal expansion in the contacting die. When the thermoelectrical material had been preformed, the caps were applied thereto by placing the element body in a close-fitting graphite die, placing the cap with the iron surface against the element body, and positioning graphite punches against each end of the body-cap assembly. The graphite die assembly was next placed in a hermetically sealed retort with a penetrating movable ram, a thermocouple well, a gas-flow tube, and an evacuation tube. This retort was placed within an electrical resistance furnace, on the bed of a hydraulic press, and the assembly was hot pressed.

The hot-pressing procedure comprised: evacuating and back-filling the retort with pure hydrogen at approximately 100° F. intervals up to about 800° F.; applying hydraulic pressure slowly over a 2–3 minute period at 1000° F. where the thermoelectric material first showed plasticity; holding the pressure for 5–10 minutes at 1250° F. for P-type and 1350° F. for N-type; relieving pressure gradually over a 5–10 minutes period, holding temperature without pressure for an additional 5–10 minute period; and finally removing the retort from the furnace and cooling it with an external blower.

The thermoelectric assembly was completed by applying a 0.002 inch layer of a commercially-available braze (Premabraz 615 - 61½% Ag, 24% Cu, 14½% In) material onto the nickel-plated surface of the shoe. A copper current strap, 0.010 inch thick, electroplated with 0.001 inch nickel, was connected to the shoe by heating the assembly at a temperature of about 1250° F.

Small thermoelectric modules made in the above-described fashion were operated for periods of time in excess of 10,000 hours at hot junction temperatures of more than 850° F. with only slight degradation in power output. The efficiency of the electrical contact was evidenced by measurements indicating an overall room-temperature contact resistance in the range of 10–25 micro ohms per inch$^2$. The electrical contacts also withstood moderate temperature cycling without significant deterioration.

EXAMPLE 2

The procedures of Example 1 were followed except that the thermoelectric materials used were N-type PbTe and P-type PbSnTe, and tungsten powder was utilized as the diffusion barrier in place of iron. The plasma spraying parameters for tungsten were:

| Tungsten powder | fine grade |
|---|---|
| Plasma gas flow | 30% |
| Powder gas flow | 30% |
| Gas type | argon |
| Current | 650 amperes |
| Distance | 2 – 3 inches |

In cases where the thermoelectric body has not been preformed, as in the above examples, the body formation and contacting may be done simultaneously. The axis of the graphite die cavity is oriented vertically and a graphite punch positioned in the lower end of the cavity, slightly extruded. Onto this punch is placed a cap, with the diffusion barrier upward, and a measured amount of thermoelectric semiconductor powder poured therein to give the desired final element length. Another cap, if it is desired to cap both ends, is placed thereon, with the sprayed surface downward, and another graphite punch thereupon. The assembly is then hot-pressed, as previously described.

The foregoing examples are to be considered as merely illustrative of the present invention and not as restrictive thereof. Variations and specific materials and techniques may be made by those skilled in the art in the light of the present disclosure, which are to be considered within the scope of the present invention. The present invention should be understood to be limited, therefore, only in the manner of the appended claims.

We claim:

1. A thermoelectric article which comprises: a thermoelectric member of the telluride class providing a first surface and a first electrically conductive member having a
   composite structure comprising
   a first relatively thick electrical conductor shoe of an austenitic stainless steel having a second surface and
   a first relatively thin adherent layer of a metal selected from the class consisting of iron, tungsten, molybdenum, and niobium directly bonded to and coextensively covering said second surface and providing a third surface,
   said first surface being in direct intimate contact with and bonded to said third surface of said first layer.

2. The article of claim 1 wherein said thin layer of metal is of iron.

3. The article of claim 1 wherein said thin layer of metal is of tungsten.

4. The article of claim 1 further including a second electrically conductive member having a composite structure comprising a second relatively thick electrical conductor shoe of an austenitic stainless steel having a fourth surface, said fourth surface being directly bonded to and coextensively covered by a second relatively thin adherent layer of a metal selected from the group consisting of iron, tungsten, molybdenum, and niobium, an opposite surface of said second layer being directly bonded to another surface of said thermoelectric member.

5. The article of claim 4 wherein said first and second layers of said metal are each of tungsten.

6. The article of claim 5 further including an electrical conductor strap metallurgically bonded to each said stainless steel shoe by a braze metal layer disposed thereinbetween.

* * * * *